June 30, 1970 HISASHI YUNOKI ET AL 3,518,583

BROAD RANGE FREQUENCY SELECTIVE ULTRA-HIGH FREQUENCY IMPEDANCE DEVICE

Filed Sept. 28, 1966 3 Sheets-Sheet 1

United States Patent Office 3,518,583

Patented June 30, 1970

3,518,583

BROAD RANGE FREQUENCY SELECTIVE ULTRA-HIGH FREQUENCY IMPEDANCE DEVICE

Hisashi Yunoki, Tokyo, Tatsuo Kudo, Kawasaki-shi, Yukio Ito, Tokyo, and Hidemitsu Komizo, Kawasaki-shi, Japan, assignors to Fujitsu Limited, Kawasaki, Japan, a Japanese corporation Filed Sept. 28, 1966, Ser. No. 582,610
Claims priority, application Japan, Sept. 30, 1965, 40/61,104
Int. Cl. H03h 7/14; H01p 3/06
U.S. Cl. 333—73 8 Claims

ABSTRACT OF THE DISCLOSURE

An impedance device for connection in an ultra-high frequency transmission line comprises a printed circuit which includes a thin dielectric plate and extremely small dimensioned resistance, capacitance and inductance components on the plate in resonant circuit connection functioning as a filter in a very broad range of frequencies up to a very high frequency. The printed circuit is electrically connected into the ultra-high frequency transmission line.

The present invention relates to an ultra-high frequency impedance device. More particularly, the invention relates to an ultra-high frequency impedance device which is frequency selective over a broad range of frequencies.

Rod or plate shaped single resistor components have been utilized as resistance devices in high frequency such as, for example, microwave, regions. Such a resistor component may be provided with a frequency characteristic by combining it with a filter. At high frequencies, and particularly in the microwave region, however, a filter has a length which is about ½ or ¼ of the normal wavelength in free space. The resistor component and filter combination thus resonates when a broad frequency operation is undertaken, and effects the operation unfavorably.

The principal object of the present invention is to provide a new and improved broad range frequency selective ultra-high frequency impedance device. The ultra-high frequency impedance device of the present invention obviates the defects of the resistor components and filters of the prior art in ultra-high frequency operation. The ultra-high frequency impedance device of the present invention utilizes and combines resistance and filter components of very small size and operates with great stability in a broad frequency region of DC to approximately 10 gigacycles per second or $10 \times 10^9$ cycles per second. The impedance or admittance is thus provided with a frequency characteristic, so the impedance device of the present invention shows almost no loss or a loss only at a specific frequency. The defects of the prior art devices are thereby overcome. The impedance device of the present invention operates with efficiency, effectiveness and reliability.

In accordance with the present invention, an impedance device is provided which is frequency selective in a broad range of frequencies and may be connected in an ultra-high frequency transmission line. The impedance device of the present invention comprises a printed circuit including extremely small dimensioned resistance, capacitance, and inductance components in resonant circuit connection functioning as a filter in a broad range of frequencies up to a very high frequency. A coupling electrically connects the printed circuit into the ultra-high frequency transmission line. The printed circuit comprises a dielectric plate and the resistance and inductance components comprise metal foil printed on the dielectric plate. The capacitance component includes a capacitance member on the dielectric plate and a part of the ultra-high frequency transmission line.

The impedance device may be of coaxial type or of strip type. A coaxial type impedance device has an axis perpendicular to the dielectric plate and the resistance component is of substantially annular configuration coaxially positioned on the dielectric plate. An impedance device of strip type comprises a dielectric plate and the resistance component comprises metal foil printed on the dielectric plate. The inductance component comprises a metal member extending transversely from the dielectric plate to a part of the transmission line.

When the transmission line is of coaxial type having an inner conductor, a strip type impedance device of the present invention comprises a dielectric plate. An inner strip of metal foil is positioned on the dielectric plate. A strip of electrical insulation is positioned on the inner strip. A rod-like conductor is connected between the inner conductor of the transmission line and the strip of insulation. The rod-like conductor is the inductance component and the capacitance appears between the rod-like conductor and the inner strip across the strip of insulation.

In order that the present invention may be readily carried into effect, it will now be described with reference to the accompanying drawings, wherein.

Figure 1:
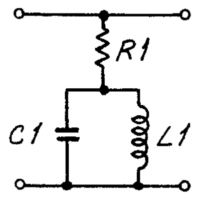
FIG. 1 is a circuit diagram of a resistor connected in series with a parallel resonant circuit.

In FIG. 1, a resistor R1 is connected in series with a parallel resonant circuit L1C1. The inductance L1 is the equivalent inductance at a high frequency and the capacitance C1 is the equivalent capacitance at a high frequency. The problem of operation must be considered from the point of view of distributed constant circuit in the high frequency region. The resistor R1 does not function as a pure resistance in the high frequency region, but rather as an impedance, since it includes inductance and capacitance at high frequencies.

In accordance with the present invention, the sizes or dimensions of the resistance, inductance and capacitance components R, L and C are made extremely small to avoid resonance at high frequencies and to prevent the generation of an excessive circuit constant.

Figure 2:
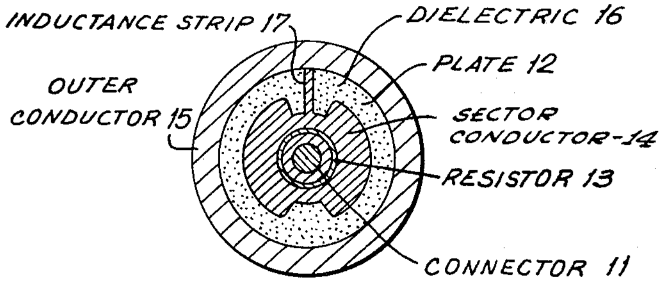
FIG. 2 is an axial sectional view of an embodiment of the impedance device of the present invention corresponding to the circuit of FIG. 1.

FIG. 2 is a structural embodiment, in accordance with the present invention, of the circuit of FIG. 1. The coaxial type impedance device of FIG. 2 includes a printed circuit plate. Electrically conductive metal foil axial area or connector 11 is printed on the printed circuit plate 12 and functions as a connector for the inner conductor (not shown) of a coaxial cable, with which the impedance device is utilized. An annular resistor 13 is printed coaxially with and around the connector 11. The resistor 13 is the resistor R1 of FIG. 1.

Another electrically conductive metal foil area or sector conductor 14 is printed coaxially with and around the resistor 13. An outer annular conductor 15 is coaxially positioned around the sector conductor 14 in spaced relation therewith in radial directions. The outer electrically conductive conductor 15 functions as the ground connection and the ground lead may extend from the central area of said conductor or may extend from the printed circuit plate 12 at high frequencies.

The area between the sector conductor 14 and the outer conductor 15 is filled with the electrical insulation or dielectric material 16 of which the printed circuit plate 12 is composed. The capacitance C1 of FIG. 1 appears between the sector conductor 14 and the outer conductor 15. A radially extending inductance strip 17 of electrically conductive metal foil is printed on the printed circuit plate 12 and electrically and physically connects the sector conductor 14 and the outer conductor 15. The inductance strip 17 provides the inductance L1 of FIG. 1.

Since the dimensions of the impedance device of FIG. 2 are small, said device functions over a broad frequency range as the circuit of FIG. 1. In an operating impedance device of FIG. 2, the outer diameter of the sector conductor 14 is 10.0 mm., the width of the inductance strip 17 is 0.15 mm. and the median diameter of the resistor 13 is 4.2 mm. The radial width of the resistor 13 is 0.5 mm., the diameter of the connector 11 is 3.0 mm. and the inner diameter of the outer conductor 15 is 10.6 mm. A load selectivity QL of approximately 2 is provided at a tuning frequency of about 2 gigacycles per second and 2 gigacycles per second is passed or reflected by the impedance device of FIG. 2 with almost no loss.

At frequencies between DC and 10 gigacycles per second, other than 2 gigacycles per second, there is loss which varies in accordance with the ratio of the resistance R1 to the characteristic impedance Z of the line and the load selectivity QL. The incident electrical power is not reflected outside the band. That is, a large loss is presented in the event of a terminal short circuit by providing the resistor 13 with a resistance value R1 which coincides with the characteristic impedance Z of the line.

Figure 3:
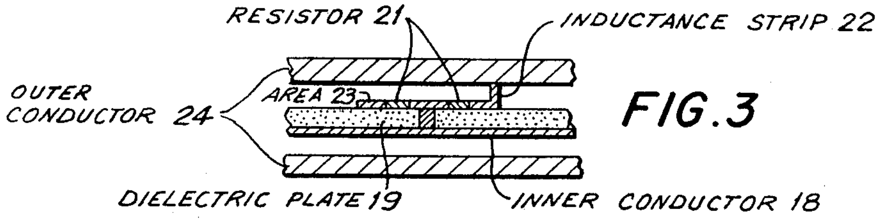
FIG. 3 is a longitudinal sectional view of a modification of the impedance device of FIG. 2.

FIG. 3 is a structural embodiment of strip type, of the circuit of FIG. 1, in accordance with the present invention. The strip type impedance device of FIG. 3 includes an inner conductor 18. A printed circuit plate 19 of electrical insulation or dielectric material has an annular resistor 21 printed thereon. The resistor 21 has the resistance of and is the resistor R1 of FIG. 1.

An inductance strip 22 of electrically conductive metal physically and electrically connects an area 23 of electrically conductive metal foil surrounding the resistor 21 and the outer electrically conductive conductor 24. The outer conductor 24 is grounded and the inductance strip 22 provides the inductance L1 of FIG. 1. The capacitance C1 of FIG. 1 appears between the metal foil area 23 and the outer conductor 24.

Figure 4:
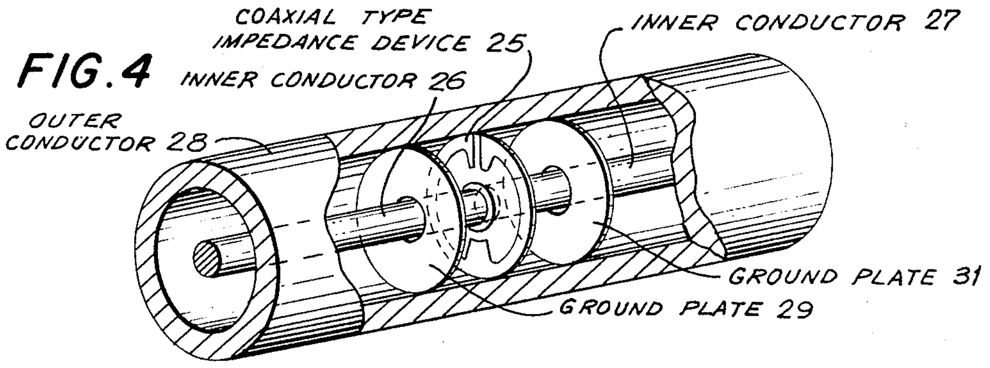
FIG. 4 is a cutaway perspective view of a coaxial cable having the coaxial type impedance device of FIG. 2 mounted therein.

In FIG. 4, the coaxial type impedance device of FIG. 2 is mounted in a coaxial cable. A coaxial type impedance device 25 is coaxially mounted on an inner conductor 26. An inner conductor 27 termintates at a small distance from the coaxial type impedance device 25. An outer conductor 28 coaxially surrounds the inner conductors 26 and 27 and the impedance device 25. Electrically conductive metal ground plates 29 and 31 are coaxially mounted on both sides of the impedance device 25 in electrical contact with the outer conductor 28, but spaced from, the inner conductors 26 and 27 and from said impedance device. The ground plate 29 is coaxially mounted on, but spaced from, the inner conductor 26 and the ground plate 31 is coaxially mounted on, but spaced from, the inner conductor 27. The ground plates 29 and 31 are thus DC insulated from their respective inner conductors 26 and 27.

The capacitance C1 appears between the coaxial type impedance device 25 and each of the ground plates 29 and 31. The arrangement of FIG. 4 is utilized when a specific frequency is to be passed and other frequencies are to be absorbed or transmitted at a specific phase. The frequency to be passed is the resonance frequency of the parallel resonant circuit C1L1 of FIG. 1.

Figure 5:
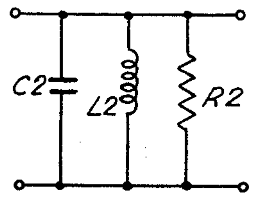
FIG. 5 is a circuit diagram of a resistor connected in parallel with a parallel resonant circuit.
Figure 6:
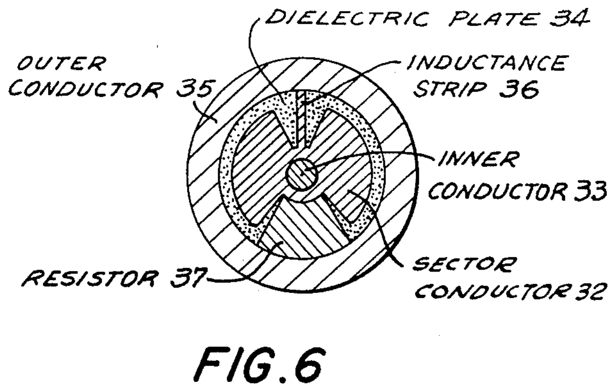
FIG. 6 is an axial sectional view of an embodiment of the impedance device of the present invention corresponding to the circuit of FIG. 5.

In FIG. 5, a resistor R2 is connected in parallel with a parallel resonant circuit L2C2. FIG. 6 is a structural embodiment, in accordance with the present invention, of the circuit of FIG. 5. In FIG. 6, an electrically conductive metal foil area or sector conductor 32 is printed coaxially with and around an inner conductor 33 on a printed circuit plate 34 of electrical insulation or dielectric material. An outer annular conductor 35 is coaxially positioned around the sector conductor 32 in spaced relation therewith in radial directions. The outer electrically conductive conductor 35 is grounded.

The area between the inductor base 32 and the outer conductor 35 is filled with the electrical insulation or dielectric material of the printed circuit plate 34. The capacitance C2 of FIG. 5 appears between the sector conductor 32 and the outer conductor 35. A radially extending inductance strip 36 of electrically conductive metal foil is printed on the printed circuit plate 34 and physically and electrically connects the sector conductor 32 and the outer conductor 35. The inductance strip 36 provides the inductance L2 of FIG. 5.

An electrically conductive resistor 37 is printed on the plate 34 in physical and electrical connection between the sector conductor 32 and the outer conductor 35. The resistor 37 is the resistor R2 of FIG. 5 and extends in a radial direction. It may be positioned at places other than that shown in FIG. 6.

The impedance device of FIG. 6 is of coaxial type, as is the device of FIG. 2, and may be provided in strip type, as is the device of FIG. 3, and in a coaxial cable, as is the arrangement of FIG. 4. The loss in the impedance device of FIG. 6 is greatest at a specific frequency and gradually decreases as reactive reflection is produced. The impedance device of FIG. 6 is utilized for absorbing only a specific determined frequency.

Figure 7:
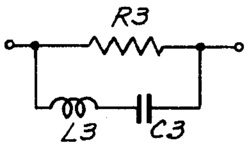
FIG. 7 is a circuit diagram of a resistor connected in parallel with a series resonant circuit.
Figure 8:
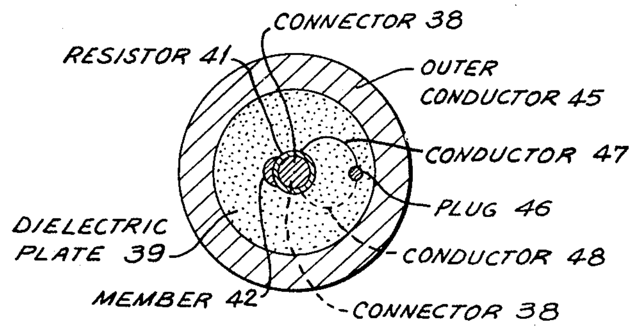
FIG. 8 is an axial sectional view of an embodiment of the impedance device of the present invention corresponding to the circuit of FIG. 7.

In FIG. 7, a resistor R3 is connected in parallel with a series resonant circuit L3C3. FIG. 8 is a structural embodiment, in accordance with the present invention, of the circuit of FIG. 7. In FIG. 8, an electrically conductive metal foil axial area or connector 38 is printed on a printed circuit plate 39 of electrical insulation or dielectric material and is electrically connected to the inner conductor of a coaxial cable (not shown in FIG. 8). The impedance device of FIG. 8 is of coaxial type. An annular resistor 41 is printed coaxially with and around the connector 38. The resistor 41 is the resistor R3 of FIG. 7.

Figure 9:
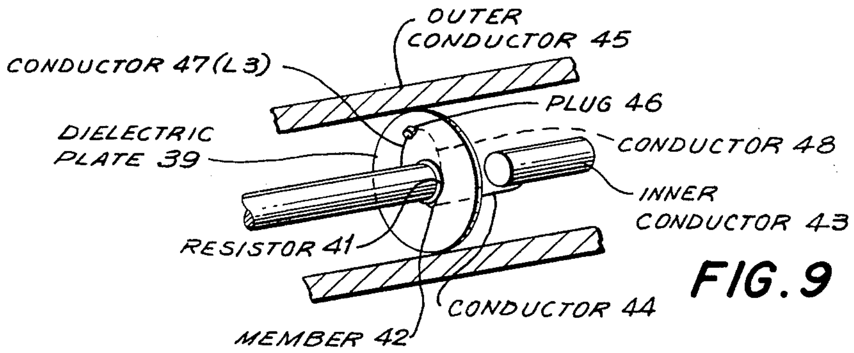
FIG. 9 is cutaway perspective view of a coaxial cable having the coaxial type impedance device of FIG. 8 mounted therein.

The inner circumference of the resistor 41 abuts and makes electrical contact with the connector 38. A metal member 42, which is electrically conductive, is mounted on the outer circumference of the resistor 41 and is electrically connected to the inner conductor 43 (FIG. 9) by an electrical conductor 44 (FIG. 9). The outer conductor 45 is electrically conductive and is grounded.

An electrically conductive metal through-plate or plug 46 extends through the dielectric plate 39 in a direction parallel to the axial direction in spaced relation from the resistor 41 and the outer conductor 45. A thin conductive line or strip 47 is printed on the dielectric plate 39 and electrically connects the connector 38 with the plug 46 on one surface of said dielectric plate and a thin conductive line or strip 48 is printed on said dielectric plate and electrically connects said connector with said plug on the other surface of said dielectric plate. The surface of the connector 38 shown in FIG. 8 to which the conductor 47 is connected, and the surface of said connector (not shown in FIG. 8), to which the conductor 48 is connected, are DC insulated from each other and are spaced a determined distance from each other.

The surface of the connector 38 (not shown in FIGS. 8 and 9) to which the conductor 48 is connected is spaced from the inner conductor 43, as shown in FIG. 9, and the capacitance C3 of FIG. 7 appears between said surface and said inner conductor. The conductor 47 provides the inductance L3 of FIG. 7.

Figures 10, 11:
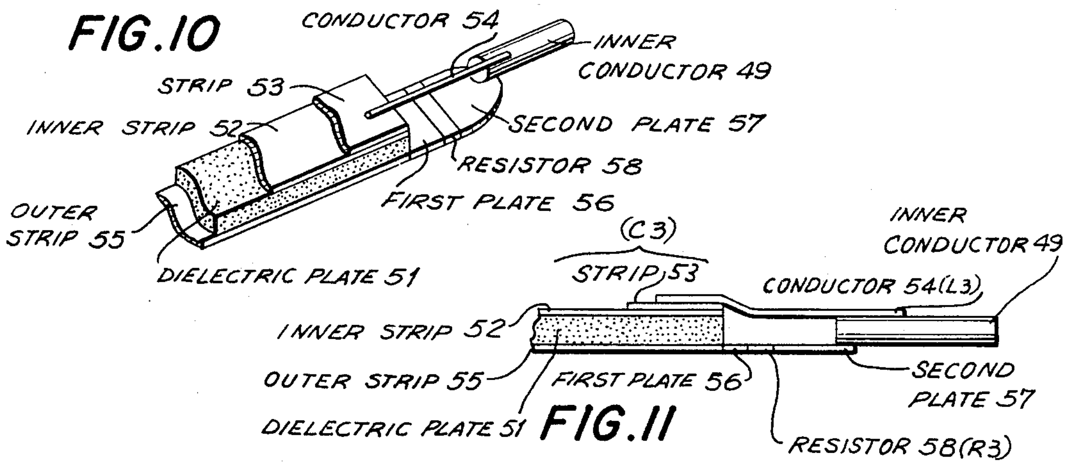
FIG. 10 is a cutaway perspective view of a modification of the impedance device of FIG. 8.
FIG. 11 is a longitudinal side view of the modification of FIG. 10.

FIGS. 10 and 11 are a structural embodiment of strip type, of the circuit of FIG. 7, in accordance with the present invention. The strip type impedance device of FIGS. 10 and 11 includes an inner conductor 49. The outer conductor is not shown in FIGS. 10 and 11 in order to maintain the clarity of illustration. The inner conductor 49 extends from the inner conductor of a coaxial cable. A printed circuit plate 51 of electrical insulation or dielectric material has an electrically conductive inner strip 52 printed thereon. The inner strip 52 is covered by a strip 53 of dielectric material which provides DC insulation.

A rod-like or wire-like electrical conductor 54 is physically and electrically connected to the inner conductor 49 and is physically connected to the dielectric strip 53 so that the capacitance C3 of FIG. 7 appears between said conductor 54 and the inner strip 52. The conductor 54 provides the inductance L3 of FIG. 7.

An electrically conductive outer strip 55 is printed on the dielectric plate 51 on the surface thereof opposite that on which the inner strip 52 is printed. A first electrically conductive metal plate 56 is physically and electrically connected to the outer strip 55. A second electrically conductive metal plate 57 is physically and electrically connected to the inner conductor 49 and extends to points whereby a space or gap is left between the adjacent ends of the first and second plates. An electrically conductive resistor 58 electrically and physically connects the adjacent ends of the first and second plates 56 and 57. The resistor 58 is the resistor R3 of FIG. 7.

In FIGS. 10 and 11, the impedance circuit R3, C3, L3 of FIG. 7 is connected in the coupling between the coaxial line, as represented by the inner conductor 49, and the strip line, as represented by the printed circuit. The impedance circuit R3, C3, L3 may be included in the same manner even if only with the strip line. In the modification of FIGS. 10 and 11, the printed circuit dielectric plate 51 is conveniently printed on both opposing surfaces.

In an operating impedance device of FIGS. 10 and 11, the strip line impedance is 50 ohms, the resistance value R3 of the resistor 58 is approximately 50 ohms and the thickness of the dielectric plate 51 is 1.6 mm. The resistor 58 is 0.5 mm. wide and the rod like conductor 54 has a diameter of 0.2 mm. and a length of 7 to 8 mm. The common overlapping area of the conductor 54 and the inner strip 52 is approximately 0.1 $mm.^2$ and the gap between said conductor and said inner strip is 0.1 mm. A load selectivity QL of approximately 1.5 is provided and the impedance device operates from DC to about 10 gigacycles per second, providing the characteristics of the circuit of FIG. 7. The impedance device of FIGS. 10 and 11 passes a specific determined frequency without loss and there is a loss at other frequencies. The loss characteristics of the impedance device of FIGS. 10 and 11 are thus essentially the same as those of the impedance device of FIG. 2.

Figure 12:
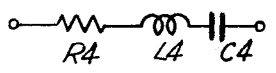
FIG. 12 is a circuit diagram of a resistor connected in series with a series resonant circuit.
Figure 13:
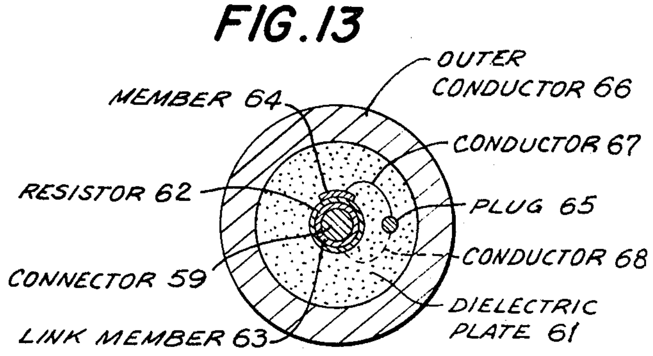
FIG. 13 is an axial sectional view of an embodiment of the impedance device of the present invention corresponding to the circuit of FIG. 12.

In FIG. 12, a resistor R4 is connected in series with a series resonant circuit L4C4. FIG. 13 is a structural embodiment, in accordance with the present invention, of the circuit of FIG. 12. In FIG. 13, an electrically conductive metal foil axial area or connector 59 is printed on a printed circuit plate 61 of electrical insulation or dielectric material and is electrically connected to the inner conductor of a coaxial cable (not shown in FIG. 13). The impedance device of FIG. 13 is of coaxial type. An annular resistor 62 is printed coaxially with, around and radially spaced from the connector 59. The resistor 62 is the resistor R4 of FIG. 12.

The inner circumference of the resistor 62 is spaced from the connector 59. An annular electrically conductive through-plate or link member 63 is coaxially positioned between the connector 59 and the inner circumference of the resistor 62 and extends through the dielectric plate 61 from one of the surfaces of said dielectric plate to the opposing surface. A metal member 64, which is electrically conductive, is mounted on the outer circumference of the resistor 62 and is electrically connected to an electrically conductive metal through-plate or plug 65.

The plug 65 extends through the dielectric plate 61 in a direction parallel to the axial direction in spaced relation from the resistor 62 and an outer conductor 66, which is electrically conductive and grounded. A thin conductive line or strip 67 is printed on the dielectric plate 61 and electrically connects the connector 59 with the plug 65 on one surface of said dielectric plate and a thin conductive line or strip 68 is printed on said dielectric plate and electrically connects said connector with said plug on the other surface of said dielectric plate.

Figure 14:
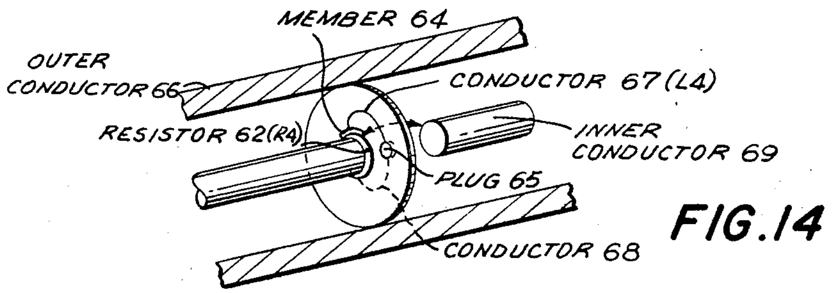
FIG. 14 is a cutaway perspective view of a coaxial cable having the coaxial type impedance device of FIG. 13 mounted therein.

The surface of the connector 59 shown in FIG. 13, to which the conductor 67 is connected, and the surface of said connector (not shown in FIG. 13), to which the conductor 68 is connected, are DC insulated from each other and are spaced a determined distance from each other. The surface of the link member 63 (not shown in FIGS. 13 and 14) is spaced from the inner conductor 69, as shown in FIG. 14, and the capacitance C4 of FIG. 12 appears between said surface and said inner conductor. The conductor 67 provides the inductance L4 of FIG. 12.

Figures 15, 16:
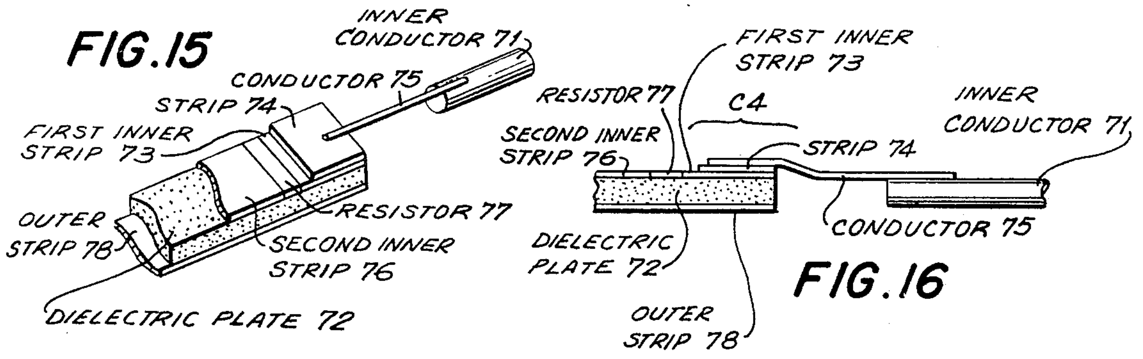
FIG. 15 is a cutaway perspective view of a modification of the impedance device of FIG. 13.
FIG. 16 is a longitudinal side view of the modification of FIG. 15.

FIGS. 15 and 16 are a structural embodiment of strip type, of the circuit of FIG. 12, in accordance with the present invention. The strip type impedance device of FIGS. 15 and 16 includes an inner conductor 71. The outer conductor is not shown in FIGS. 15 and 16 in order to maintain the clarity of illustration. The inner conductor 71 extends from the inner conductor of a coaxial cable. A printed circuit plate 72 of electrical insulation or dielectric material has an electrically conductive first inner strip 73 printed thereon. The first inner strip 73 is covered by a strip 74 of dielectric material which provides DC insulation.

A rod-like or wire-like electrical conductor 75 is physically and electrically connected to the inner conductor 71 and is physically connected to the dielectric strip 74 so that the capacitance C4 of FIG. 12 appears between said conductor 75 and the first inner strip 73. The conductor 75 provides the inductance L4 of FIG. 12.

A second inner strip 76 of electrically conductive metal is printed on the dielectric plate 72 in spaced relation from the first inner strip 73, so that a space or gap is formed on said dielectric plate between said first and second inner strips. An electrically conductive resistor 77 is printed on the dielectric plate 72 and electrically and physically connects the adjacent ends of the first and second inner strips 73 and 76 by being positioned in the gap formed between said first and second inner strips. The resistor 77 is the resistor R4 of FIG. 12. An electrically conductive outer strip 78 is printed on the dielectric plate 72 on the surface thereof opposite that on which the first and second inner strips 73 and 76 are printed.

Figure 17:
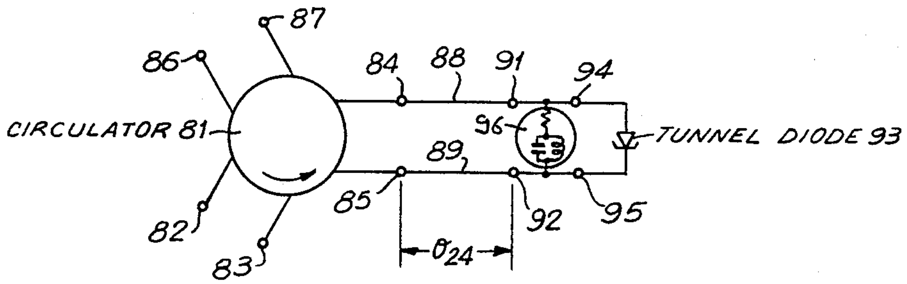
FIG. 17 is a circuit diagram of an embodiment of a circulator reflection type tunnel diode amplifier circuit utilizing the impedance device of the present invention.

FIG. 17 shows a circulator reflection type tunnel diode amplifier circuit utilizing the impedance device of the present invention. In FIG. 17, a three terminal circulator 81 has input terminals 82 and 83, output terminals 84 and 85 and reflected wave output terminals 86 and 87. In actual practice, another circulator (not shown) is connected to the input and output terminals of the circulator 81.

A coupling line 88, 89 connects the output terminals 84 and 85 with circuit terminals 91 and 92, respectively. The coupling line 88, 89 has an electrical length of $\theta 24$ radians and is selected to provide optimum phase surfaces of a tunnel diode 93 and the circulator 81 at the signal frequency. The tunnel diode 93 is connected between a pair of circuit terminals 94 and 95.

An impedance device 96 of the present invention, represented by its equivalent circuit, is connected across the circuit terminals 91 and 92 and across the circuit terminals 94 and 95. In the embodiment of FIG. 17, the impedance device of FIGS. 2 or 3 is utilized. The bias circuit of the tunnel diode 93 is not shown in order to maintain the clarity of illustration.

In the amplifier circuit of FIG. 17, the frequency characteristic of the admittance, when the circulator 81 is viewed from circuit terminals 91 and 92, normally varies irregularly within the corresponding frequency range of the negative characteristic of the tunnel diode, when the impedance device 96 of the present invention is not utilized. It is thus impossible to provide stable amplification even when the tunnel diode 93 is directly connected to the circuit terminals 91 and 92.

When the impedance device 96 of the present invention is connected between the circuit terminals 91 and 92, however, said impedance device does not attenuate the signal frequency at the output terminals 84 and 85, but such signal frequency is fed to the circuit terminals 94 and 95. There is loss at frequencies outside the signal frequency band, and the signal frequency is changed in phase by the impedance device 96. The frequency characteristic of the admittance, when the load is viewed from the circuit terminals 94 and 95, is thus provided with a specific phase surface and conductance outside the signal frequency band. A stable amplification is thereby provided.

The utilization of the impedance device of the present invention in an amplifier which amplifies over a broad range such as, for example, a tunnel diode amplifier, thus provides stable amplification over a broad range. The extremely small dimensions of the impedance device of the present invention permit said impedance device to function as a frequency selective device as inductance and capacitance over a broad range of frequencies up to an extremely high frequency.

While the invention has been described by means of specific examples and in specific embodiments, we do not wish to be limited thereto, for obvious modifications will occur to those skilled in the arts without departing from the spirit and scope of the invention.

We claim:

1. An impedance device which is frequency selective in a broad range of frequencies for connection in an ultrahigh frequency transmission line, said impedance device comprising printing circuit means including extremely small dimensioned resistance, capacitance and inductance components in resonant circuit connection functioning as a filter in a broad range of frequencies up to a very high frequency, said printed circuit means comprising a dielectric plate and said resistance and inductance components comprise metal foil printed on said dielectric plate and said capacitance component including a capacitance member on said dielectric plate and a part of said ultra-high frequency transmission line; and coupling means for electrically connecting said printed circuit means into said ultra-high frequency transmission line.

2. An impedance device as claimed in claim 1, wherein said impedance device is of coaxial type having an axis perpendicular to said dielectric plate and said resistance component is of substantially annular configuration coaxially positioned on said dielectric plate.

3. An impedance device as claimed in claim 1, wherein said impedance device is of coaxial type having an axis perpendicular to said dielectric plate and said inductive component is of substantially narrow strip configuration positioned on said dielectric plate.

4. An impedance device as claimed in claim 1, wherein said transmission line is of coaxial type having an inner conductor and a coaxial outer conductor and said impedance device is of coaxial type having an axis perpendicular to said dielectric plate, said impedance device being positioned in coaxial relation with and in said transmission line with a gap between one surface of said impedance device and the inner conductor of said transmission line and the capacitance of said capacitance component appearing at said gap.

5. An impedance device of strip type which is frequency selective in a broad range of frequencies for connection in an ultra-high frequency transmission line, said impedance device comprising printed circuit means including extremely small dimensioned resistance, capacitance and inductance components in resonant circuit connection functioning as a filter in a broad range of frequencies up to a very high frequency, said printed circuit means comprising a dielectric plate, said resistance component comprising a metal foil printed on said dielectric plate and said inductance component comprising a metal member extending transversely from said dielectric plate to a part of said transmission line; and coupling means for electrically connecting said printed circuit means into said ultra-high frequency transmission line.

6. An impedance device of strip type which is frequency selective in a broad range of frequencies for connection in an ultra-high frequency transmission line of coaxial type having an inner conductor, said impedance device comprising printed circuit means including extremely small dimensioned resistance, capacitance and inductance components in resonant circuit connection functioning as a filter in a broad range of frequencies up to a very high frequency, said printed circuit means comprising a dielectric plate, an inner strip of metal foil on said dielectric plate, a strip of electrical insulation on said inner strip and a rod-like conductor connected between the inner conductor of said transmission line and said strip of insulation, said rod-like conductor being said inductances component and said capacitance appearing between said rod-like conductor and said inner strip across said strip of insulation; and coupling means for electrically connecting said printed circuit means into said ultra-high frequency transmission line.

7. An impedance device as claimed in claim 6, wherein said impedance device includes an outer strip of metal foil on the opposite surface of said dielectric plate from that of said inner strip and said resistance component is positioned between a pair of electrically conductive metal plates in electrical contact with each of said plates, one of said plates being in electrical contact with the inner conductor of said transmission line and the other of said plates being in electrical contact with the outer strip of said impedance device.

8. An impedance device as claimed in claim 6, wherein said inner strip of metal foil comprises first and second inner strips of metal foil on said dielectric plate spaced from each other to form a gap therebetween and said resistance component is positioned on said dielectric plate between said first and second inner strips in electrical contact with both said inner strips.

References Cited

UNITED STATES PATENTS

| | | | |
|---|---|---|---|
| 2,648,804 | 8/1953 | Steigerwalt et al. | 317—101 |
| 2,859,417 | 11/1958 | Arditi | 333—84 X |
| 2,899,608 | 8/1959 | Wellard | 317—101 |
| 2,984,802 | 5/1961 | Dyer et al. | 333—84 X |
| 3,109,983 | 11/1963 | Cooper et al. | 317—101 X |
| 3,167,729 | 1/1965 | Hall | 333—73 |

HERMAN KARL SAALBACH, Primary Examiner

T. J. VEZEAU, Assistant Examiner

U.S. Cl. X.R.

333—84